United States Patent [19]

Miljanic et al.

[11] Patent Number: 5,357,210
[45] Date of Patent: Oct. 18, 1994

[54] TRANSCONDUCTANCE AMPLIFIER CIRCUIT

[75] Inventors: Petar N. Miljanic, Belgrade, Yugoslavia; Eddy So, Gloucester, Canada

[73] Assignee: National Research Council of Canada, Ottawa, Canada

[21] Appl. No.: 141,367

[22] Filed: Jul. 7, 1993

[51] Int. Cl.[5] .............................................. H03F 1/26
[52] U.S. Cl. ................................... 330/15.1; 330/196; 330/197
[58] Field of Search ....................... 330/151, 165–167, 330/171, 195–197

[56] References Cited

U.S. PATENT DOCUMENTS

| | | | |
|---|---|---|---|
| 3,656,831 | 4/1972 | Seidel | 330/151 X |
| 3,810,256 | 5/1974 | Van Doorn | 330/151 X |
| 4,795,969 | 1/1989 | So . | |
| 4,884,038 | 11/1989 | Miljanic . | |

OTHER PUBLICATIONS

So, "A Current–Comparator–Based Load Loss Standard For In–Situ Calibration of Transformer Loss Measuring Systems", IEEE Transactions on Power Delivery, vol. 3, No. 4, Oct. 1988.
Miljanic, "Calibrator for Alternating Voltage, Current and Power", IEEE Transactions on Instrumentation and Measurement, vol. 38, No. 2, Apr. 1989.
Miljanic et al., "High Precision Range Extenders for an AC Calibrator up to 600 V and 100 A", IEEE Transactions on Instrumentation and Measurement, vol. 40, No. 2, Apr. 1991.

Primary Examiner—James B. Mullins
Attorney, Agent, or Firm—J. Wayne Anderson

[57] ABSTRACT

A transconductance amplifier circuit employs the known combination of a transconductance amplifier and a current comparator (with or without a ratio extender, preferably in the form of a two-stage current transformer) to compare the output current from the transconductance amplifier with that flowing through a reference resistor, both these currents having been derived from the same alternating input voltage. A current corresponding to the unbalanced ampere-turns in the current comparator is used to produce a feed-forward error signal that is used to modify the output of the transconductance amplifier. The invention is characterized by an output transformer that has coaxial inner and outer toroidal magnetic cores, and primary and correction windings outside the outer core. This primary winding receives the output current from the transconductance amplifier and the correction winding receives the error signal. A winding located between the cores detects the error current in the output transformer (its magnetizing current), and injects this error current into the current comparator. The secondary of the output transformer can be a single turn conductor extending through the hole formed by its toroidal cores. The result of this circuit arrangement is that the output current in the secondary of the output transformer follows the amplitude and phase of the input voltage with a very high level of accuracy.

8 Claims, 2 Drawing Sheets

TRANSCONDUCTANCE AMPLIFIER CIRCUIT

FIELD OF THE INVENTION

The invention relates to a transconductance amplifier circuit, i.e. a circuit that delivers an alternating output current that reproduces an alternating input voltage in both amplitude and phase.

BACKGROUND OF THE INVENTION

Such transconductance amplifier circuits are known, and have served the commercial purpose of providing a controlled current source, which may be required in a number of practical applications, one example being the testing and calibration of wattmeters.

The basic requirement of a transconductance amplifier in precision measurements is that it faithfully reproduce the input voltage waveform as a current. This result has traditionally been achieved by measuring the output current with a resistive shunt and using the shunt voltage drop as a feedback signal to compare with the input. However, when a large output current is involved, it is difficult to construct a shunt that will have sufficient magnitude stability and a sufficiently low phase angle error. The current comparator is an instrument that has been used as a means to overcome this problem, its very accurate ratio characteristics enabling a high value resistor with small magnitude and phase errors to be used as a reference.

PRIOR ART

One example of a combination of a current comparator with a transconductance amplifier is provided in E. So's U.S. Pat. No. 4,795,969 issued Jan. 3, 1989 (also published in IEEE Transactions on Power Delivery, Vol. 3, No. 4, October 1988 under the title "A Current-Comparator-Based Load Loss Standard for In-situ Calibration of Transformer Loss Measuring Systems"). This patent discloses coupling the output from a transconductance amplifier (through a two-stage current transformer) to a current comparator to enable comparison of such output with a current proportional to the input voltage derived from a reference resistor. Any unbalanced ampere-turns in the current comparator are detected and used to generate a feedback signal that is applied to the input of the transconductance amplifier.

A variation of this technique employing a feed-forward correction signal is disclosed in P. N. Miljanic's U.S. Pat. No. 4,884,038 issued Nov. 28, 1989. See also P. N. Miljanic "Calibrator for Alternating Voltage, Current, and Power", published in IEEE Transactions on Instrumentation and Measurement, Vol. 38, No. 2, April 1989; and P. N. Miljanic et al. "High Precision Range Extenders for an AC Calibrator up to 600 V and 100 A", published in IEEE Transactions on Instrumentation and Measurement, Vol. 40, No. 2, April 1991. The feed-forward technique employs an unbalance signal from a current comparator to directly modify the output of the transconductance amplifier, rather than to achieve this result indirectly by modifying the input to such amplifier.

SUMMARY OF THE INVENTION

In the prior feedback circuits there could be stability problems causing oscillation, depending upon the type of load of the overall system. The prior feed-forward circuits lack isolation of the output current, which is required when feeding into a high voltage circuit.

The principal object of the present invention is to overcome these problems.

Another object of the present invention is to provide a circuit that, not only has improved stability of operation and effective isolation of the output current, but can deliver these improvements while operating with high current outputs, e.g. up to 1000 amps or greater.

For these purposes the invention builds on the basic prior art assembly of (a) a transconductance amplifier for generating an output current corresponding to an input voltage, (b) a reference resistor also connected across the input voltage for providing a reference current, and (c) current comparator means (a current comparator preferably together with a two-stage current transformer or other ratio extender) for comparing currents that are respectively proportional to the output and reference currents and for generating a feed-forward error signal proportional to an unbalance between the compared currents. This error signal (preferably subject to amplification) is then applied to the output current.

The novel addition to this basic assembly provided by the present invention, includes passing the output current through an output transformer (current injecting transformer) that comprises inner and outer coaxially arranged toroidal magnetic cores. This output transformer has a primary winding and a correction winding both extending around the outer core so as to couple electromagnetically with both cores, and a detection winding located between the cores that couples electromagnetically only with the inner core. The primary winding is connected to receive the output current from the transconductance amplifier; the correction winding is connected to receive the feed-forward error signal; and the detection winding is connected to inject back into the current comparator means a current that corresponds to the error of the output transformer (its magnetizing current). The secondary winding of this output transformer preferably takes the form of a single conductor extending through the hole defined by the toroidal cores.

Other features of specific embodiments of the invention, together with their performance and advantages, will be described below in relation to the drawings.

DETAILED DESCRIPTION OF THE PREFERRED EMBODIMENTS

Figure 1:
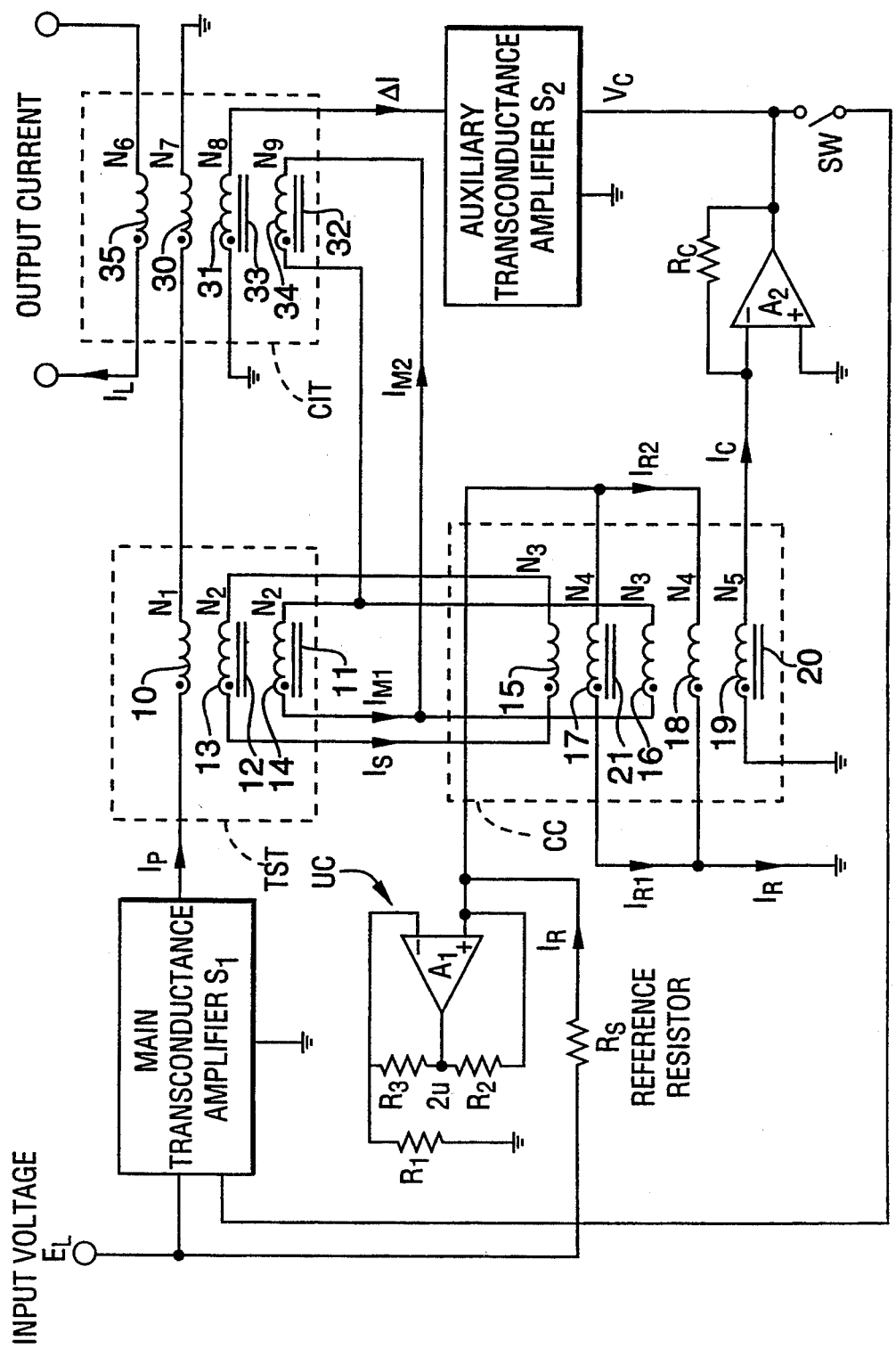
FIG. 1 is a circuit diagram of a preferred embodiment of the invention.

FIG. 1 shows a main transconductance amplifier $S_1$ connected to receive an alternating input voltage $E_L$. The output current $I_P$ from the amplifier $S_1$ is passed first through a primary winding 10 of a two-stage current transformer TST and finally through a primary winding 30 of an output or so-called current injecting transformer CIT.

The two-stage current transformer TST has inner and outer, preferably toroidal, cores 11 and 12, and two secondary windings 13 and 14. All three windings 10, 13 and 14 couple electromagnetically with the inner core 11, while only the outer windings 10 and 14 couple electromagnetically with the outer core 12. The secondary windings 13, 14 are respectively connected across a ratio winding 15 and a compensation winding 16 of a current comparator CC. The current comparator CC also includes a ratio winding 17 and a compensating winding 18 connected in parallel with each other across the input voltage $E_L$ through a reference resistor $R_S$ that is chosen to be stable and have a low phase defect. Finally, the current comparator CC has a winding 19 for detecting any unbalance of ampere-turns.

The current comparator CC has inner and outer toroidal magnetic cores 20 and 21. All the windings 15–19 couple electromagnetically with the inner core 20, while only the outer windings 15 and 17 couple electromagnetically with the outer core 21. The two-stage current transformer TST itself, the current comparator CC itself, and their combination are all known, having been shown in FIG. 1 of the So patent referred to above. The two-stage transformer TST acts as a ratio extender for the current comparator CC and could be replaced by an electronically-aided current transformer; or it could even be omitted entirely if the system were used with only small currents. In this latter case, the output current $I_P$ from the transconductance amplifier $S_1$ would be passed directly through a ratio of the current comparator. With or without the ratio extending function of the current transformer TST employed, one or both of the ratio and compensation windings of the current comparator CC passes a total measurement current proportional to the current $I_P$, and hence a current that includes the error in the current $I_P$ arising from the imperfection of the main transconductance amplifier $S_1$.

An amplifier $A_1$ with resistors $R_1$, $R_2$ and $R_3$ (the values of $R_1$ and $R_3$ being the same) constitutes an unloading circuit UC, i.e. a circuit that unloads the combined impedance of the windings 17 and 18 from the circuit comprising the input voltage $E_L$ and the reference resistor $R_S$, thus maintaining the total current $I_R$ through the windings 17, 18 independent of such combined impedance. This unloading circuit is known per se, and, although its use is preferred, it also can be omitted if the combined impedance of the windings 17, 18 is small or negligible with respect to the resistance value of the reference resistor $R_S$.

The detection winding 19 of the current comparator CC provides a current $I_C$ that represents an error feedforward signal to be applied ultimately to the output transformer CIT. However, because the amplitude of the current $I_C$ is small, it is preferably amplified by a current to voltage amplifier $A_2$ with an associated resistor $R_C$ to produce a voltage $V_C$, followed by a second or auxiliary transconductance amplifier $S_2$ to produce the final error current $\Delta I$ from its input voltage $V_C$. This current $\Delta I$ is passed through a correction winding 31 of the output transformer CIT.

Figure 2:
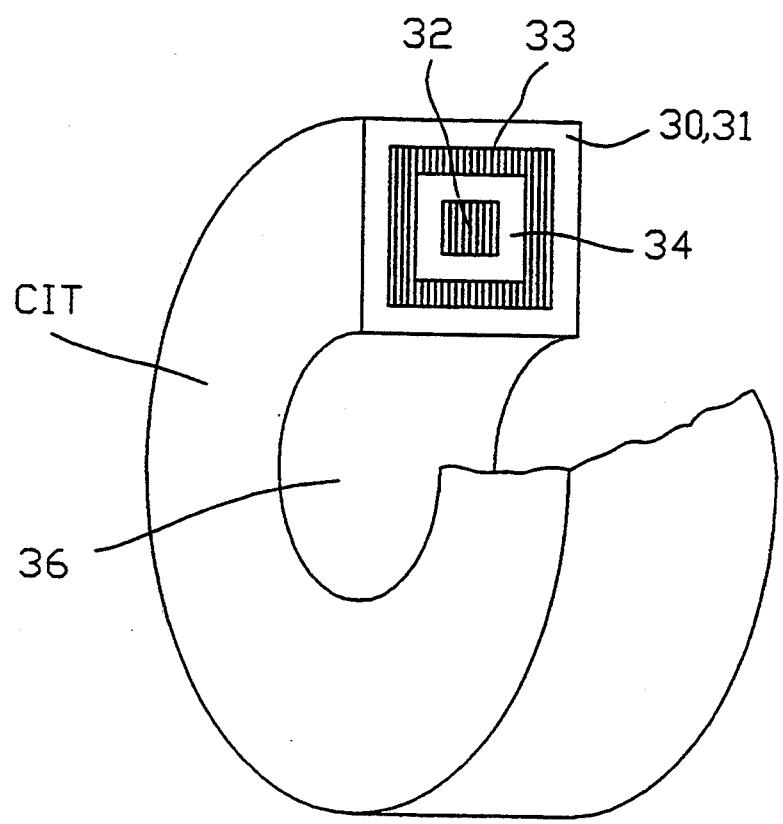
FIG. 2 is a cut-away perspective view of an output transformer used in this circuit.

The transformer CIT (seen physically in FIG. 2) is toroidal and has inner and outer cores 32 and 33, a correction winding 31 outside the outer core 33, and a detection winding 34 between the cores. A secondary winding 35 is also shown in the circuit of FIG. 1, but only forms part of the transformer when it is connected to an external circuit that receives the output current $I_L$, since the function of the secondary winding will normally be performed by a heavy conductor or busbar (not shown) extending through the hole 36 defined by the toroidal cores, thus constituting a single turn secondary. Only the outer windings 30, 31 and 35 couple electromagnetically with the outer core 33, while all the windings 30, 31, 32 and 35 couple electromagnetically with the inner core 32.

The output from the detection winding 34, i.e. the magnetizing current $I_{M2}$ of the transformer CIT, is connected across the compensation winding 16 of the current comparator CC to be added to the magnetizing current $I_{M1}$ of the current transformer TST.

The numerals $N_1$ to $N_9$ in FIG. 1 signify the number of turns on the respective windings of the transformers TST and CIT and the current comparator CC.

The current comparator CC provides a means for measuring the combined errors caused by the magnitude and phase errors of the main transconductance amplifier $S_1$ and the magnetizing error of the output transformer CIT. These combined errors are measured indirectly, using the current comparator CC and its ratio extender TST, by comparing the sum of the output current $I_P$ of the main transconductance amplifier $S_1$ (reduced proportionately by the two-stage current transformer TST) and the magnetizing current $I_{M2}$ of the output transformer CIT, with the reference current $I_R$ obtained by applying the input voltage $E_L$ through the reference resistor $R_S$. The unbalanced ampereturns in the current comparator CC is therefore a measure of these combined errors. The voltage $V_C$ proportional to this unbalance ampere-turns, derived from the detection winding 19 through the amplifier $A_2$, is then used to drive the auxiliary transconductance amplifier $S_2$ to provide the feed-forward error current $\Delta I$ to the correction winding 31 of the output transformer CIT, resulting in a highly accurate and stable load current $I_L$ in the secondary of such transformer.

Neglecting the capacitive currents in the current-ratio devices and assuming negligible loading effect on the two-stage current transformer TST, the following equations are valid within an accuracy of a few parts per million (ppm)

$$N_1 \cdot I_P - N_2 \cdot (I_S + I_{M1}) = 0 \tag{1}$$

$$N_7 \cdot I_P + N_8 \cdot \Delta I - N_6 \cdot I_L - N_9 \cdot I_{M2} = 0 \tag{2}$$

$$N_4 \cdot (E_L / R_S) - N_3 \cdot I_S - N_3 \cdot (I_{M1} - I_{M2}) - N_5 \cdot I_C = 0 \tag{3}$$

$$I_P = E_L \cdot G_M \tag{4}$$

$$\Delta I = R_C \cdot I_C \cdot G_A. \tag{5}$$

Equations (1), (2) and (3) show the ampere-turn balances of the two-stage current transformer TST, the output transformer CIT, and the current comparator CC, respectively. Equation (4) gives the output current of the main transconductance amplifier $S_1$ as a function of its input voltage $E_L$ and its transconductance $G_M$, i.e. its output current divided by its input voltage. Finally, equation (5) gives the error feed-forward current $\Delta I$ as a function of the feedback resistor $R_C$ of the amplifier $A_2$, the transconductance $G_A$ of the auxiliary transconductance amplifier $S_2$, and the current $I_C$ in the detection winding 19 of the current comparator CC.

If $$N_1 \cdot N_9 = N_2 \cdot N_7 \tag{6}$$

$$G_M = (1/R_S) \cdot (N_2/N_1) \cdot (N_4/N_3) \cdot (1 + e_M) \tag{7}$$

$$G_A = (1/R_C) \cdot (N_5/N_3) \cdot (N_9/N_8) \cdot (1 + e_A) \tag{8}$$

$$e_{M2} = (N_9/N_6) \cdot (I_{M2}/I_L) \tag{9}$$

where $e_M$, $e_A$, are the complex errors of the in-phase and quadrature components of the main and auxiliary transconductance amplifiers, respectively, and $e_{M2}$ is the complex error due to the magnetizing current of the output transformer CIT, then the following expression for the output load current $I_L$ can be derived $$I_L = (N_4/N_3) \cdot (N_9/N_6) \cdot (E_L/R_S) \cdot (1 + e_A \cdot (e_{M2} - e_M)). \tag{10}$$

With this error feed-forward technique, the remaining errors are errors of an error and these are negligible. Equation (10) therefore becomes $$I_L = (N_4/N_3) \cdot (N_9/N_6) \cdot (E_L/R_S). \tag{11}$$

As a result, a highly accurate current will be established in the single turn secondary of the output transformer CIT which is thus an inductive coupling device with the unique property that, without a galvanic connection, the current established in the secondary conductor threaded through the hole 36 is highly accurate to a few ppm. This property is important, because it enables the overall transconductance amplifier circuit to feed a highly accurate output current to an external circuit that can be operated at a high voltage that is isolated from the transconductance amplifier circuit itself.

Nonlinearities in the main transconductance amplifier S₁ could cause distortion in the waveform of its output current $I_P$. This, in turn, could cause a high harmonic content in the unbalanced ampere-turns signal $V_C$. These harmonics could saturate the amplifier A₂ and/or the auxiliary transconductance amplifier S₂, causing a large error in the feed-forward error signal ΔI, thereby compromising the overall accuracy of the output current $I_L$. To minimize this problem, and also the effects of large drifts in the main transconductance amplifier S₁, a switch SW can be closed to establish a feedback of the unbalanced ampere-turns signal $V_C$ to the input of the main transconductance amplifier S₁. Since only minimal loop gain in this feedback is required, no instability problems causing oscillation can arise.

Solely by way of specific examples not limiting the invention, some of the values that can typically be used are as follows.

The main transconductance amplifier S₁ is a commercial transconductance amplifier of 3 kVA, its input being redesigned to accept an input voltage of up to 100 V with manual adjustment of both the magnitude and phase of the output current up to 20 A. Thus the nominal transconductance of the amplifier is $G_M = 0.2$ S and its compliance voltage at 20 A is 150 V.

The output transformer CIT is designed for operation up to 1000 ampere-turns with a 3 kVA burden. With a one-turn secondary winding, it is capable of providing a load current $I_L$ of up to 1000 A with an equivalent compliance voltage of 3 V. The magnetic cores of this output transformer are such that one completely encloses the other in a toroidal shielding arrangement. The primary winding 30 has 50 turns, being made of five windings of 50 turns each connected in parallel. The number of turns of the secondary winding 35 depends on how many turns are threaded through the hole 36. For a single turn secondary winding, to provide a load current of up to 1000 A, a copper bar insulated for high-voltage operation of up to 50 kV is used. If more turns are required, for load currents lower than 1000 A, then a high-voltage cable with a suitable connector arrangement to obtain 1, 2, 3, 4, 6 or 12 turns can be used. The correction winding 31, driven from the auxiliary transconductance amplifier S₂ by the error feedforward current ΔI, has only one turn. The detection winding 34 has 1000 turns and is wound uniformly around the inner magnetic core 32. The current $I_{M2}$ in the detection winding 34 is proportional to the magnetizing error or the magnetizing component of the current in the primary winding 30. As already explained, this magnetizing error current is added to the error component of the output current $I_P$ of the main transconductance amplifier, using the current comparator CC with its ratio extender TST, to obtain the total combined error. The combined error, proportional to the unbalanced ampere-turns in the current comparator is then used to drive the auxiliary transconductance amplifier S₂, which in turn provides the error feed-forward current ΔI to the correction winding 31.

The auxiliary transconductance amplifier S₂ is a commercial transconductance amplifier of 20 VA with a nominal transconductance of $G_A = 1$ S and an accuracy of better than 1000 ppm at the power frequencies. This relatively small amplifier provides an error current ΔI up to 10 A rms. The current ΔI can be made as small as possible by minimizing the output of the amplifier A₂ which is the total combined error derived from the detection winding 19 of the current comparator. This is achieved by manually adjusting the magnitude and phase of the output current $I_P$ of the main transconductance amplifier S₁ for a minimum output of the amplifier A₂. The current ΔI consists of mainly higher harmonic components, due to the distortion in the waveform of the output current $I_P$ of the main transconductance amplifier S₁ caused by nonlinearities in the amplifier. An oscilloscope can be used to monitor the output of the amplifier A₂.

The ratio windings 15 and 17 (and their corresponding compensation windings 16 and 18) have one turn and 100 turns respectively. The current comparator has a nominal current rating of one ampere-turn. The reference current $I_R$, derived from the input voltage through a 10 kΩ reference resistor $R_S$, is driven through the parallel connection of windings 17 and 18. Although the voltage across these windings is very small, the unloading circuit UC is useful in reducing the quadrature error of the reference current to the one ppm level. The value of R₂ is nominally equal to $R_S$.

The primary winding 10 of the two-stage current transformer TST is a 5-turn winding and the secondary windings 13 and 14 are 100-turn windings. To minimize the loading effect, the first stage secondary winding 13 is connected to the ratio winding 15 of the current comparator and the second stage secondary winding 14 is connected to the corresponding compensation winding 16 inside the magnetic shield 21. This winding 16 is also used to introduce into the current comparator CC the magnetizing current $I_{M2}$ of the transformer CIT. A 250-turn detection winding 19 is connected to the current-to-voltage converter (amplifier A₂) to obtain the voltage $V_C$ proportional to, and in-phase with, the unbalanced ampere-turns in the current comparator.

From equation (10), the stability and accuracy of the load current $I_L$ are determined primarily by the basic ratio accuracy of the current comparator CC, and the stability and phase defect of the reference resistor $R_S$.

The combined errors due to the errors of the main transconductance amplifier $S_1$, the auxiliary transconductance amplifier $S_2$, and the output transformer CIT are second order errors. The accuracy and stability requirements of the two transconductance amplifiers and those of the output transformer are, therefore, not critical. The error term $e_A \cdot (e_{M2} - e_M)$ in equation (10) can be made to be very small (less than one ppm), by adjusting the complex error $e_M$ of the main transconductance amplifier $S_1$ to be equal and opposite to the magnetizing error $e_{M2}$ of the transformer CIT. This can be achieved by adjusting the magnitude and phase errors, using the manual adjustments of the main transconductance amplifier $S_1$, such that the output of the amplifier $A_2$ is zero or minimum, since such output is a measure of the unbalanced ampere-turns in the current comparator, which in turn is a measure of the combined error ($e_{M2} - e_M$). This condition may change due to instabilities in the adjustments, and/or output changes in the main transconductance amplifier $S_1$ caused by nonlinearities or temperature effects. However, the overall effect of the combined error will still be negligible. For example, if the change due to a drift in the amplifier is 1000 ppm and the error $e_A$ of the auxiliary transconductance amplifier $S_2$ is 1000 ppm, then the error term $e_A \cdot (e_{M2} - e_M)$ is only 1 ppm. The ratio errors of the current comparator including that of its ratio extender TST are no greater than ±5 ppm in both magnitude and phase. The stability and phase defect angle at the power frequencies of the reference resistor $R_S$ are ±5 ppm and ±5 μrad, respectively. The overall estimated uncertainties of the load current $I_L$ are therefore not more than ±10 ppm in both magnitude and phase (the root-sum-of-squares of the errors are 7 ppm for both magnitude and phase).

We claim:

1. A transconductance amplifier circuit comprising:
   (a) a transconductance amplifier for generating an alternating output current corresponding to an alternating input voltage,
   (b) a reference resistor for providing a reference current corresponding to the input voltage, and
   (c) current comparator means for comparing currents respectively proportional to said output and reference currents and for generating a feed-forward error signal proportional to an unbalance ampere-turns signal between said compared currents,
   characterized by an output transformer comprising
   (d) inner and outer coaxially arranged toroidal magnetic cores,
   (e) a primary winding and a correction winding extending around the outer core to couple electromagnetically with both cores,
   (f) a detection winding located between the cores to couple electromagnetically only with the inner core,
   (g) means for connecting the primary winding to receive the output current from the transconductance amplifier,
   (h) means for connecting the correction winding to receive the error signal, and
   (i) means for connecting the detection winding to the current comparator means to inject thereinto a current corresponding to the error of the output transformer.

2. A circuit according to claim 1, wherein said current comparator means comprise a current comparator and a ratio extender therefor, said ratio extender comprising a two-stage current transformer 3. A transconductance amplifier circuit comprising:
   (a) a main transconductance amplifier for generating an alternating output current corresponding to an alternating input voltage,
   (b) an output transformer comprising:
      (i) an inner toroidal magnetic core,
      (ii) a detection winding on said inner core,
      (iii) an outer toroidal magnetic core extending coaxially with and radially outward of the detection winding, and
      (iv) a primary winding and a correction winding both extending around the outer core,
      (v) the cores defining a hole through which a secondary conductor can extend,
   (c) means for passing said output current of the transconductance amplifier through the primary winding of the output transformer to generate a secondary current in a said conductor in said hole,
   (d) a reference resistor for providing a reference current corresponding to the input voltage,
   (e) current comparator means for comparing said reference current with a measurement current proportional to said output current of the transconductance amplifier, and for generating an error current representative of an unbalance ampere-turns between said reference and measurement currents,
   (f) means for passing said error current through the correction winding of the output transformer, and
   (g) means connecting the detection winding of the output transformer to said current comparator means for modifying said error current by a magnetizing current of the output transformer.

4. A circuit according to claim 3, wherein said current comparator means comprise a current comparator and a ratio extender therefor, said ratio extender comprising a two-stage current transformer, 5. A circuit according to claim 4, wherein said current comparator comprises:
   (a) inner and outer magnetic cores,
   (b) first and second ratio windings both extending around the outer core to couple electromagnetically with both cores, and
   (c) a detection winding and first and second compensating windings all located between the cores to couple electromagnetically only with the inner core,
   and wherein said two-stage current transformer comprises
   (d) inner and outer magnetic cores,
   (e) a primary winding and a first secondary winding both extending around the outer core to couple electromagnetically with both cores, and
   (f) a second secondary winding located between the cores to couple electromagnetically only with the inner core,
   the circuit including
   (g) means for connecting the primary winding of the two-stage current transformer to receive the output current of the transconductance amplifier,
   (h) means for connecting the first secondary winding of the two-stage current transformer across the first ratio winding of the current comparator,
   (i) means for connecting the second secondary winding of the two-stage current transformer across the first compensation winding of the current comparator, (j) means for connecting the second ratio winding and the second compensating winding of the current comparator in parallel with each other and to the reference resistor whereby together to pass the reference current, (k) means for connecting the detection winding of the current comparator to said means for passing an error current through the correction winding of the output transformer, and (l) means for connecting the detection winding of the output transformer across the first compensation winding of the current comparator.

6. A circuit according to claim 5, wherein said means for passing an error current through the correction winding of the output transformer comprise (m) a current to voltage amplifier having an input connected to the detection winding of the current comparator and a voltage output, and (n) an auxiliary transconductance amplifier having an input connected to receive said voltage output and an output connected to the correction winding of the output transformer.

7. A circuit according to claim 6, including means for connecting said voltage output to an input of the main transconductance amplifier as a feedback signal.

8. A circuit according to claim 5, including an unloading circuit connected between the reference resistor and the current comparator to cause the reference current to remain independent of the impedance of the windings of the current comparator through which said reference current flows.

* * * * *